United States Patent
Lee et al.

(10) Patent No.: US 12,400,859 B2
(45) Date of Patent: Aug. 26, 2025

(54) METAL HARD MASK FOR PRECISE TUNING OF MANDRELS

(71) Applicant: International Business Machines Corporation, Armonk, NY (US)

(72) Inventors: Joe Lee, Niskayuna, NY (US); Yann Mignot, Slingerlands, NY (US); Christopher J. Penny, Saratoga Springs, NY (US); Koichi Motoyama, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 17/875,756

(22) Filed: Jul. 28, 2022

(65) Prior Publication Data

US 2024/0038535 A1    Feb. 1, 2024

(51) Int. Cl.
*H01L 21/033* (2006.01)
*H01L 21/027* (2006.01)
(Continued)

(52) U.S. Cl.
CPC ...... *H01L 21/0337* (2013.01); *H01L 21/0276* (2013.01); *H01L 21/0335* (2013.01); *H01L 21/0338* (2013.01); *H01L 21/3086* (2013.01); *H01L 21/3088* (2013.01); *H01L 21/31144* (2013.01); *H01L 21/32139* (2013.01);
(Continued)

(58) Field of Classification Search
None
See application file for complete search history.

(56) References Cited

U.S. PATENT DOCUMENTS 7,687,369 B2    3/2010  Koh et al.
8,586,482 B2   11/2013  Arnold et al.
(Continued)

FOREIGN PATENT DOCUMENTS

CN    119585844 A     3/2025
TW    201834146 A     9/2018
WO    2024/022857 A1  2/2024

OTHER PUBLICATIONS

Anonymous, "Pitch multiplication with Simplified Litho and RIE Process", IP.com No. IPCOM000256093D, IP.com Electronic Publication Date: Nov. 2, 2018, 3 pages.
(Continued)

*Primary Examiner* — Jiong-Ping Lu
(74) *Attorney, Agent, or Firm* — Scully, Scott, Murphy & Presser, P.C.; Samuel Waldbaum

(57) ABSTRACT

A method of forming a mandrel for use in a pitch doubling process is provided in which a metal hard mask is inserted between a mandrel material layer and a soft mask. The insertion of the metal hard mask allows for easier pattern transfer into the mandrel material layer and avoids many issues encountered during multi-patterning steps. The insertion of the metal hard mask forms a square mandrel that has a flat top due to durability against etch and ability to wet strip the metal hard mask. The metal hard mask can be tuned before pattern transfer into the underlying mandrel material layer to provide a hard mask pattern that is smaller or larger than the pattern without performing such tuning. The method also can be used to protect the downstream non-mandrel processes where selectivity is crucial.

25 Claims, 4 Drawing Sheets

(51) Int. Cl.
*H01L 21/308* (2006.01)
*H01L 21/311* (2006.01)
*H01L 21/3213* (2006.01)
*H01L 21/768* (2006.01)

(52) U.S. Cl.
CPC .. *H01L 21/76816* (2013.01); *H01L 21/76897* (2013.01); *H01L 21/0332* (2013.01)

(56) References Cited

U.S. PATENT DOCUMENTS

| | | |
|---|---|---|
| 8,664,115 B2 | 3/2014 | Bartsch et al. |
| 8,796,150 B2 | 8/2014 | Akinmade-Yusuff et al. |
| 9,006,106 B2 | 4/2015 | Kao et al. |
| 9,129,906 B2 | 9/2015 | Wu et al. |
| 9,679,815 B2 | 6/2017 | Lee et al. |
| 9,755,049 B2 | 9/2017 | Paak et al. |
| 10,115,726 B2 | 10/2018 | Kang et al. |
| 10,510,540 B2 | 12/2019 | Zhang et al. |
| 10,923,363 B1 | 2/2021 | Das et al. |
| 2006/0046422 A1* | 3/2006 | Tran ............... H01L 21/0337 257/E21.68 |
| 2011/0129991 A1* | 6/2011 | Armstrong .......... H01L 21/3088 430/323 |
| 2013/0001749 A1 | 1/2013 | Arnold et al. |
| 2015/0155198 A1* | 6/2015 | Tsai ................. H01L 21/32133 438/674 |
| 2016/0372334 A1* | 12/2016 | Mignot ............. H01L 21/0276 |
| 2018/0261457 A1 | 9/2018 | Law et al. |
| 2019/0080908 A1 | 3/2019 | Lee et al. |
| 2019/0096666 A1* | 3/2019 | Zhou ................ H01L 21/28123 |
| 2019/0206725 A1 | 7/2019 | Chu et al. |
| 2020/0126996 A1* | 4/2020 | Panda ............... H01L 21/32139 |
| 2021/0035815 A1 | 2/2021 | Das et al. |
| 2021/0242020 A1 | 8/2021 | O'meara et al. |
| 2022/0102143 A1 | 3/2022 | Chen et al. |

OTHER PUBLICATIONS

International Searching Authority, "Notification of Transmittal of the International Search Report and the Written Opinion of the International Searching Authority, or Declaration," Patent Cooperation Treaty, Feb. 10, 2023, 9 pages, International Application No. PCT/EP2023/069748.

* cited by examiner

METAL HARD MASK FOR PRECISE TUNING OF MANDRELS

BACKGROUND

The present application relates to semiconductor technology, and more particularly to a method of forming mandrels for use in semiconductor structure formation.

With continuous scale-down and shrinkage of real estate available for a semiconductor device, engineers are facing the challenge of how to meet the market demand for ever increasing device density. One technique for sub-80 nm pitch patterning is to achieve twice the pattern density through a technique called sidewall image transfer (SIT), also known as sidewall spacer image transfer. In a conventional SIT process, mandrels are first formed on at least one material layer that needs to be patterned, followed by SIT spacer formation, and then mandrel removal. The SIT spacers are used to pattern the at least one material layer that lies beneath the SIT spacers. After patterning the at least one material layer, the SIT spacers are removed to reveal patterned structures that are made from the at least one material layer. In SIT and other pitch doubling patterning processes, a soft mask is used in the formation of the mandrels. Mandrels formed using solely soft masks as the pattern mask are not dependable and it is difficult to form tightly pitched mandrels.

SUMMARY

A method of forming a mandrel for use in a pitch doubling process such as, for example, self-aligned litho-etch-litho-etch (SALELE), is provided in which a metal hard mask is inserted between a mandrel material layer and a soft mask. The insertion of the metal hard mask allows for easier pattern transfer into the mandrel material layer and avoids many issues encountered during multi-patterning steps. The insertion of the metal hard mask forms a square mandrel that has a flat top due to durability against etch and ability to wet strip the metal hard mask. The metal hard mask can be tuned before pattern transfer into the underlying mandrel material layer to provide a hard mask pattern that is smaller or larger than the pattern without performing such tuning. The method also can be used to protect the downstream non-mandrel processes where selectivity is crucial.

In one aspect of the present application, methods of forming mandrels are provided. In one embodiment, the method includes forming a plurality of metal hard masks on top of a mandrel material layer that is positioned above at least one material layer, and patterning the mandrel material layer utilizing the plurality of metal hard masks as etch masks so as to provide a plurality of mandrels, wherein the mandrels have a pitch that is less than 36 nm.

In some embodiments, the at least one material layer is present in a back-end-of-the-line (BEOL) region of a semiconductor structure. Thus, the method of the present application can be used in patterning BEOL structures such as for example, electrically conductive structures (lines or vias) and/or dielectric material structures.

In some embodiments, the at least one material layer (within the BEOL region or outside the BEOL region) is a dielectric material, an electrically conductive material or any combination thereof.

In some embodiments, the pitch of the mandrels is from 26 nm to 35 nm so that tightly spaced mandrels are formed.

In some embodiments, each of the metal hard masks has a first lateral width, and the method further includes tuning the first lateral width to a second lateral width that is different from the first lateral width. In one example, the first lateral width is greater than the second lateral width, and the tuning includes shrinking the first lateral width utilizing an etching process that removes a portion of each of the metal hard masks. In another example, the first lateral width is less than the second lateral width, and the tuning includes forming a metal spacer along the sidewall of each of the metal hard masks.

In some embodiments, one or more mandrel underlying masking layers are formed between the mandrel material layer and the at least one material layer. The one or more mandrel masking layers are used to pattern the at least one material layer and provide a smooth landing surface for the mandrel material layers.

In some embodiments, the forming of the plurality of metal hard masks includes forming a mandrel patterning material stack on the mandrel material layer, wherein the mandrel patterning material stack includes a metal hard mask layer and a soft mask material layer, forming a patterned photoresist on top of the mandrel patterning material stack, the patterned photoresist having a mandrel pattern, and transferring the mandrel pattern into the soft mask material layer and the metal hard mask material layer of the mandrel patterning material stack by etching so as to provide a plurality of soft masks and the plurality of metal hard masks, respectively. In embodiments, each soft mask is removed prior to the patterning of the mandrel material layer.

In some embodiments, mandrel patterning material stack further includes a dielectric oxide layer located between the metal hard mask material layer and the soft mask material layer, wherein the dielectric oxide layer is converted to a plurality of dielectric oxide masks during the transferring of the mandrel pattern. The presence of the dielectric oxide layer can provide improved defectivity during lithographic rework.

In some embodiments, the metal hard mask layer is composed of titanium nitride, the dielectric oxide layer is composed of silicon dioxide, the soft mask material layer is composed of an organic planarization layer material, and the mandrel material layer is composed of silicon nitride.

In embodiments, the method further includes forming a mandrel pitch doubling spacer along sidewalls of each of the mandrels and each of the metal hard masks.

In another embodiment, the method includes forming a plurality of metal hard masks on top of a mandrel material layer that is positioned above at least one material layer that is present in the back-end-of-the-line (BEOL) region of a semiconductor structure, wherein the one material layer is a dielectric material, an electrically conductive material or any combination thereof, and patterning the mandrel material layer utilizing the metal hard masks as etch masks so as to provide a plurality of mandrels having a pitch from 26 nm to 64 nm.

In yet another embodiment, the method includes forming a plurality of metal hard masks having a first lateral width on top of a mandrel material layer that is positioned above at least one material layer, shrinking the first lateral width of each of the metal hard masks to a second lateral width by etching, and patterning the mandrel material layer utilizing the metal hard masks having the second lateral width as etch masks so as to provide a plurality of mandrels.

In yet a further embodiment, the method includes forming a plurality of metal hard masks having a first lateral width on top of a mandrel material layer that is positioned above at least one material layer, increasing the first lateral width of each of the metal hard masks to a second lateral width by forming a metal spacer along a sidewall of each of the metal hard masks, and patterning the mandrel material layer utilizing the metal hard masks having the second lateral width as etch masks so as to provide a plurality of mandrels.

DETAILED DESCRIPTION

Figure 1A:
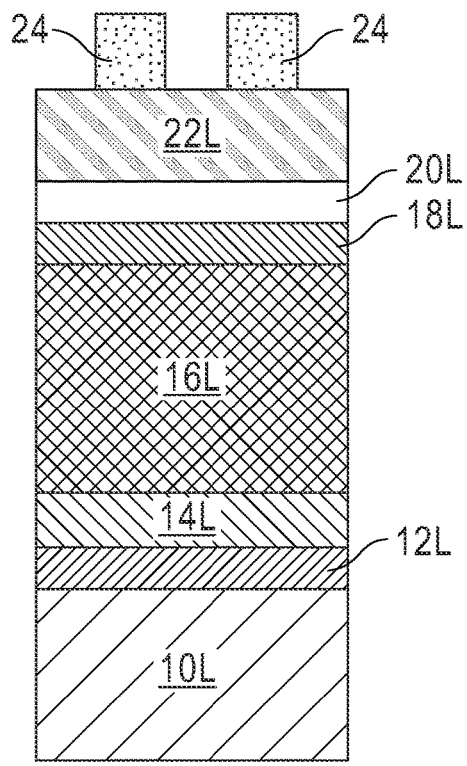
FIGS. 1A-1D are cross sectional views illustrating basic processing steps that can be used in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

At aggressive pitches, a traditional soft mask (i.e., an organic planarization layer (OPL)) used for multipatterned mandrel formation undergoes aspect ratio induced flopover, which can limit the mask height. Further, the etch selectivity of soft mask materials is insufficient, thereby needing an alternative masking material that is easy to remove, but holds up better. Even further, the tight process window of pattern transfer has become more challenging at smaller pitches, making it difficult to obtain a desired critical dimension (CD) within such a window. A flexible method for tuning the CD without introducing defectivity is difficult to achieve with standard dry etching.

The present application circumvents the above problems by inserting a metal hard mask into a pitch doubling process such as, for example, SALELE, for the formation of mandrels that in some embodiments have a sub 36 nm pitch. The insertion of the metal hard mask stack allows for easier pattern transfers and avoids many issues encountered during multi-patterning steps. Due to durability against etching and the ability to strip the metal hard mask, square mandrels having a flat topmost surface can be formed. Moreover, the present application provides precise size control of the mandrels that are formed by tuning the metal hard mask pattern to be smaller or larger than an original metal hard mask pattern without performing such tuning. The method of the present application can also be used to protect the downstream non-mandrel processes where selectivity is crucial. These and other aspects and advantages of the method of the present application will now be described in greater detail.

Referring first to FIGS. 1A-1D, there are illustrated basic processing steps that can be used in one embodiment of the present application. Notably, FIGS. 1A-1D illustrate a method in accordance with the present application of forming mandrels having a base pattern; the term "base pattern" denotes a pattern that is formed without tuning the size (i.e., lateral width) of the metal hard masks that are being used. Notably and as is shown in FIG. 1A, the method begins by forming a structure that includes at least one material layer 10L that needs to be patterned. The structure can also include one or more optional mandrel underlying masking layers. In FIG. 1A, a first mandrel underlying masking layer 12L and a second mandrel underlying masking layer 14L are shown by way of one example. The structure further includes a mandrel material layer 16L that is present above the at least one material layer 10L; in the illustrated embodiment shown in FIG. 1A the optional mandrel underlying masking layers 12L, 14L are located between the mandrel material layer 16L and the at least one material layer 10L. The structure even further includes a mandrel patterning material stack located on the mandrel material layer 16L. The mandrel patterning material stack includes a metal hard mask layer 18L, an optional dielectric oxide layer 20L, and a soft mask material layer 22L. The structure yet even further includes a patterned photoresist 24 located on top of the mandrel patterning material stack.

The at least one material layer 10L that can be employed in the present application is typically, but not necessarily always, present in the BEOL region of a semiconductor structure. As known is to those skilled in the art, the BEOL region is an area of a semiconductor structure where wiring structures are formed. Such wiring structures provide interconnection to the individual devices that are present in the front-end-of-the-line (FEOL). The at one material layer 10L that can be employed in the present application can be composed of a dielectric material, an electrically conductive material, or any combination thereof including a multilayered stack that includes a dielectric material and an electrically conductive material.

The dielectric material that can be used as the at least one material layer 10L includes any material that has electrically insulating properties including, but not limited to, silicon dioxide, silicon nitride, undoped silicate glass (USG), fluorosilicate glass (FSG), borophosphosilicate glass (BPSG), a spin-on low-k dielectric material, a chemical vapor deposition (CVD) low-k dielectric material or any combination thereof. The term "low-k" as used throughout the present application denotes a dielectric material that has a dielectric constant of less than 4.0. All dielectric constants mentioned herein are measured in a vacuum unless otherwise stated. Illustrative low-k dielectric materials that can be used include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. When a dielectric material is employed as the at least one material layer 10L, the dielectric material can be formed utilizing a deposition process including, for example, chemical vapor deposition (CVD), plasma enhanced chemical vapor deposition (PECVD), evaporation, or spin-on coating.

The electrically conductive material that can be used as the at least one material layer 10L includes an electrically conductive metal, an electrically conductive metal alloy or any combination thereof including a multilayered stack. Examples of electrically conductive metals that can be used to provide the at least one material layer 10L include, but are not limited to, copper (Cu), aluminum (Al), tungsten (W), ruthenium (Ru), cobalt (Co) or iridium (Ir). Examples, of electrically conductive metal alloys that can be used to provide the at least one material layer 10L include, but are not limited to, a Cu—Al alloy, a Co—Ru alloy, or a W—Co alloy. When an electrically conductive material is employed as the at least one material layer 10L, the electrically conductive material can be formed utilizing a deposition process such as, for example, CVD, PECVD, physical vapor deposition (PVD), sputtering, chemical solution deposition or plating. In one example, the at least one material layer 10L includes a layer of Ru that is formed on one of the dielectric materials, e.g., silicon dioxide, as mentioned above.

The at least one material layer 10L can have various thicknesses depending on the material(s) used to provide the at least one material layer 10L and the method that is used in forming the same. In one example, and when the at least one material layer 10L is composed of a layer of Ru, the at least one material layer 10L can have a thickness from 10 nm to 100 nm.

The one or more mandrel underlying masking layers (i.e., masking layers that are located beneath the mandrel material layer 16L) that can be used in the present application can include, but are not limited to, a dielectric hard mask material, a metal hard mask material and/or a landing material layer. Illustrative examples of dielectric hard mask materials include, but are not limited to, silicon nitride or silicon oxynitride. Illustrative examples of metal hard mask materials include, but are not limited to, TiN, TiO$_x$, Ru or W. Illustrative examples of landing material layers include, but are not limited to, amorphous silicon (a-Si), silicon oxide, TiN, nitrides, or conductive metals. In one example, a first mandrel underlying masking layer 12L and a second mandrel underlying masking layer 14L are employed. In such an embodiment, the first mandrel underlying masking layer 12L is composed of a material that is compositionally different from the second mandrel underlying masking layer 14L. In one example, the first mandrel underlying masking layer 12L is composed of TiN and the second mandrel underlying masking layer 14L is composed of a-Si. Such a combination of mandrel underlying masking layers is especially suitable to be used in patterning an at least one material layer 10A that is composed of an electrically conductive metal or an electrically conductive metal alloy as mentioned above to provide a patterned electrically conductive structure (e.g., Ru-containing structure) that is square and has a flat topmost surface.

The one or more mandrel underlying masking layers can be formed utilizing a deposition process including, but not limited to, CVD, PECVD, PVD, spin-on coating, evaporation, sputtering, chemical solution deposition, plating or atomic layer deposition (ALD). The one or more mandrel underlying masking layers can have various thicknesses depending on the material(s) used to provide the one or more mandrel underlying masking layers and the method that is used in forming the same. In one example, the one or more mandrel underlying masking layers can have a thickness from 5 nm to 40 nm. In one specific example when the first mandrel underlying masking layer 12L is composed of TiN and the second mandrel underlying masking layer 14L is composed of a-Si, the first mandrel underlying masking layer 12L can have a thickness from 5 nm to 20 nm, while the second mandrel underlying masking layer 14L can have a thickness from 5 nm to 20 nm.

The mandrel material layer 16L is a sacrificial material that is typically composed of a dielectric material such as, for example, silicon nitride or silicon oxide. Other types of sacrificial materials such as, for example, a-Si, a-C or organic layers can be used as the mandrel material layer 16L. The mandrel material layer 16L can be formed utilizing a deposition process including, but not limited to, CVD, PECVD, PVD, or ALD. The mandrel material layer 16L can have a thickness from 20 nm to 80 nm, and more typically from 40 nm to 60 nm; although other thicknesses are contemplated and can be used as the thickness of the mandrel material layer 16L.

The metal hard mask layer 18L of the mandrel patterning material stack includes a metal hard mask material including, but not limited to, TiN, TiO$_x$, Ru or W. In one example, TiN is used as the metal hard mask material 18L and is used to pattern a mandrel material layer 16L that is composed of silicon nitride. The metal hard mask layer 18L typically forms a direct interface with the mandrel material layer 16L. The metal hard mask layer 18L can be formed utilizing a deposition process including, but not limited to, CVD, PECVD, PVD, ALD, sputtering or plating. The metal hard mask layer 18L can have a thickness from 10 nm to 25 nm; although other thicknesses are contemplated and can be used as the thickness of the metal hard mask layer 18L.

In some embodiments, the mandrel patterning material stack further includes dielectric oxide layer 20L. In other embodiments, the dielectric oxide layer 20L is omitted. Dielectric oxide layer 20L is typically used for protection of the metal hard mask layer 18L during rework. In embodiments, the dielectric oxide layer 20L forms an interface with the metal hard mask layer 18L. The dielectric oxide layer 20L is typically composed of silicon dioxide, although other dielectric oxide materials such as, for example, nitrides, SiOCN or SiCN can be used as the material that provides the dielectric oxide layer 20L. Dielectric oxide layer 20L can be formed utilizing a deposition process including, but not limited to, CVD, PECVD, ALD, or PVD. The dielectric oxide layer 20L can have a thickness from 10 nm to 25 nm; although other thicknesses are contemplated and can be used as the thickness of the dielectric oxide layer 20L.

The soft mask material layer 22L of the mandrel patterning material stack is composed of an organic material such as, for example, an organic planarization layer (OPL) material. In embodiments, the soft mask material layer 22L forms an interface with the dielectric oxide layer 20L or with the metal hard mask layer 18L, if the dielectric oxide layer 20L is omitted. The soft mask material layer 22L can be formed utilizing a deposition process including, but not limited to, CVD, PECVD, ALD, spin-on coating or evaporation. The soft mask material layer 22L can have a thickness from 40 nm to 60 nm; although other thicknesses are contemplated and can be used as the thickness of the soft mask material layer 22L.

The patterned photoresist 24 that is located on top of the mandrel patterning material stack is composed of any photoresist material including, for example, a negative-tone photoresist material, a positive-tone photoresist material or a hybrid-photoresist material that includes a combination of negative-tone and positive-tone photoresist materials. The patterned photoresist 24 can be formed by lithography. Lithography includes depositing at least a photoresist material on top of the soft mask material layer 22L, exposing the as deposited photoresist material to a pattern of irradiation (in the present application the pattern of irradiation forms a mandrel pattern), and developing the exposed as deposited photoresist material. In embodiments, one or more photolithographic masking layers such as, for example, a bottom antireflective coating (BARC), can be formed between the soft mask material layer 22L and the as deposited photoresist material. For clarity, the one or more photolithographic masking layers are not shown in the drawings of the present application.

Figure 1B:
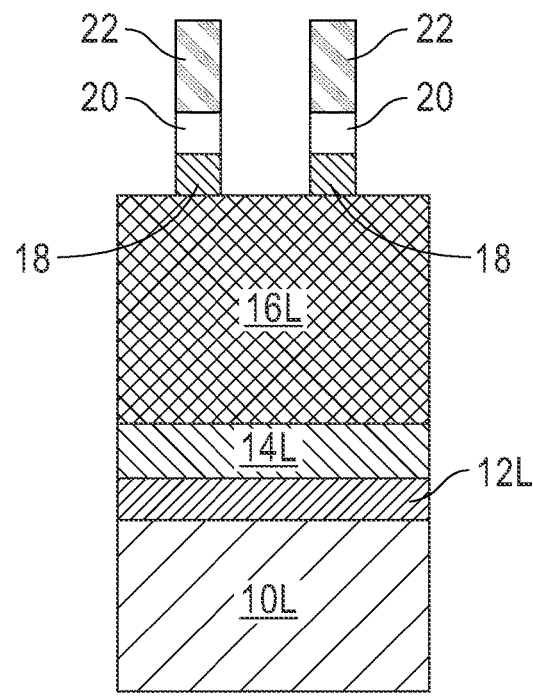

Referring now to FIG. 1B, there is illustrated the structure of FIG. 1A after transferring the pattern (i.e., mandrel pattern) provided by the patterned photoresist 34 into the mandrel patterning material stack, i.e., into the soft mask material layer 22L, the optional dielectric oxide layer 20L and the metal hard mask material layer 18L to provide a plurality of mandrel masks, each mandrel mask is composed of a remaining portion of the soft mask material layer 22L, a remaining position of the optional dielectric oxide layer 20L, and a remaining portion of the metal hard mask layer 18L. The remaining portion of the soft mask material layer 22L can be referred to herein as a soft mask 22, the remaining portion of the optional dielectric oxide layer 20L can be referred to herein as a dielectric oxide mask 20 and the remaining portion of the metal hard mask material layer 18 can be referred to herein as a metal hard mask 18. Each mandrel mask has a mandrel pattern and a portion thereof will be subsequently used to pattern the mandrel material layer 16L. Each mandrel mask typically has a lateral width, as measured from one of the sidewalls to the opposing sidewall, of from 6 nm to 16 nm.

Within each mandrel mask, the soft mask 22, the optional dielectric oxide mask 20 and the metal hard mask 18 have sidewalls that are typically vertically aligned with each other. Each mandrel mask typically has sidewalls that are oriented perpendicular to the horizontal topmost surface of the mandrel material layer 16L; some inward or outward tapering of the mandrel masks may however occur. The number of mandrel masks that are formed can vary and is not limited to the exemplary embodiment shown in FIG. 1B in which two spaced apart mandrel masks are formed.

The pattern transfer shown in FIG. 1B can be performed utilizing one or more etching processes. The one or more etching processes stop on the topmost surface of the mandrel material layer 16L. The one or more etching processes include dry etching, wet chemical etching or a combination thereof. Dry etching can include, but is not limited to, reactive ion etching (RIE), ion beam etching (IBE) or plasma etching. In one example, the one or more etching processes used to provide the structure shown in FIG. 1B include a RIE process utilizing an ashing step ($N_2/H_2$ or $O_2$), an oxide etch ($CF_4$) and TiN etch ($Cl_2$).

The patterned photoresist 24 is removed from the structure as is shown in FIG. 1B utilizing conventional resist removal processes such as, for example, a resist stripping process. The removal of the patterned photoresist 24 can occur anytime after the pattern is transferred into the soft mask material layer 22L.

Figure 1C:
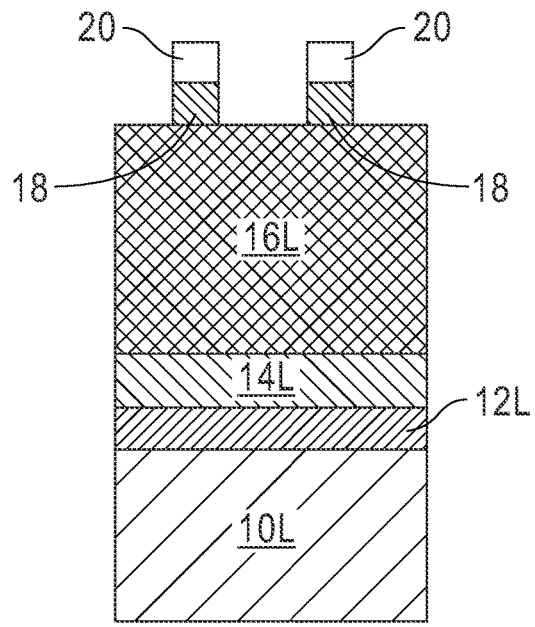

Referring now to FIG. 1C, there is illustrated the structure shown in FIG. 1B after removing the soft mask 22 from each mandrel mask leaving behind the metal hard mask 18 and, if present, the dielectric oxide mask 20. The removal of the soft mask 22 from each mandrel mask can be performed by ashing or any other technique that is selective in removing the soft mask 22 from the mandrel masks. This step is performed to reduce the aspect ratio and prevent line flopover from a less hardy layer. In some embodiments, the removal of the soft mask 22 can be omitted and the mandrel masks shown in FIG. 1B can be used to pattern the mandrel material layer 16L.

Figure 1D:
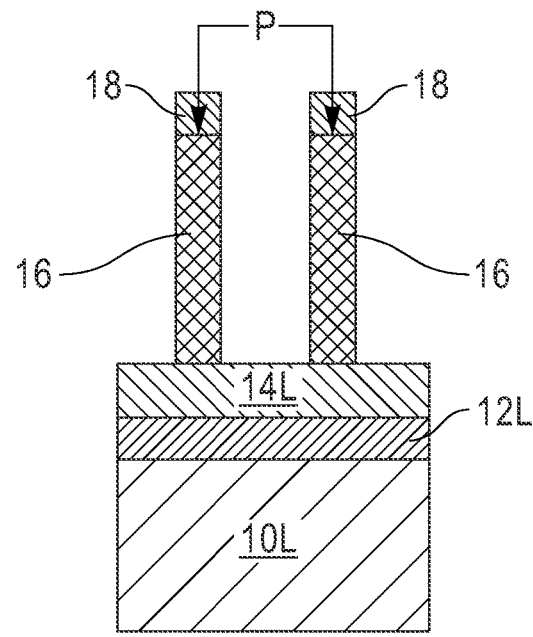

Referring now to FIG. 1D, there is illustrated the structure shown in FIG. 1C after transferring the pattern (i.e., mandrel pattern) into the mandrel material layer 16L. The transferring of the pattern into the mandrel material layer 16L provides a plurality of mandrels 16 (two are shown in FIG. 1D by way of one example) above the at least one material layer 10L. The transferring of the pattern into the mandrel material layer 16L includes one or more etching processes (dry etching and/or chemical etching as defined above) which stop on the one or more mandrel underlying masking layers (e.g., the second mandrel underlying masking layer 14L shown in FIG. 1D) or, if the one or more mandrel underlying masking layers is not present, on the at least one material layer 10L. After or prior to patterning the mandrel material layer 16L into mandrels 16, the dielectric oxide mask 20 can be removed utilizing a material removal process that is selective in removing the dielectric oxide that provides the dielectric oxide mask 20.

The mandrels 16 that are formed utilizing the metal hard mask 18 are square and, after metal hard mask 18 removal, have a flat topmost surface. The mandrels 16 that are formed in the present application have sidewalls that are substantially perpendicular to the horizontal topmost surface of the at least one material layer 10L. The term "substantially perpendicular" is used herein to denote that the sidewalls of the mandrels 16 are 90°±10% relative to the topmost horizontal surface of the at least one material layer 10L. In some embodiments, the pitch of the mandrels is from 26 nm to 64 nm. In some embodiments, the pitch of the mandrels 16 is less than 36 nm, and more typically from 26 nm to 35 nm. The pitch is measured from one point of one of the mandrels 16 to the same point on a nearest neighboring mandrel 16. In the present application, and as shown in FIG. 1D, the pitch can be from a middle portion of two laterally adjacent mandrels 16.

The mandrels 16 that are formed utilizing the metal hard mask 18 do not undergo ratio induced flopover, which can limit the mask height. No wiggling or collapse of the metal hard mask 18 are observed. Further, the metal hard mask 18 is easy to remove utilizing a material removal process that is selective in removing the metal that provides the metal hard mask 18 and the metal hard mask 18 holds upper better during the patterning of the mandrel material layer 16L.

After patterning the mandrel material layer 16L, conventional pitch doubling processing steps are then performed including forming a mandrel pitch doubling spacer (not shown) on the sidewalls of each of the mandrels 16, removing the mandrels 16 after mandrel pitch doubling spacer formation, and subsequent patterning of the underlying at least one material layer 10L utilizing the mandrel pitch doubling spacers as an etch mask. In embodiments of the present application, the metal hard masks 18 can be removed prior to, or after, mandrel pitch doubling spacer formation utilizing a material removal process that is selective in removing the metal hard mask material. In some embodiments, the removal of the metal hard masks 18 occurs after mandrel pitch doubling spacer formation so to add protection during the downstream pitch doubling processing.

Figure 2A:
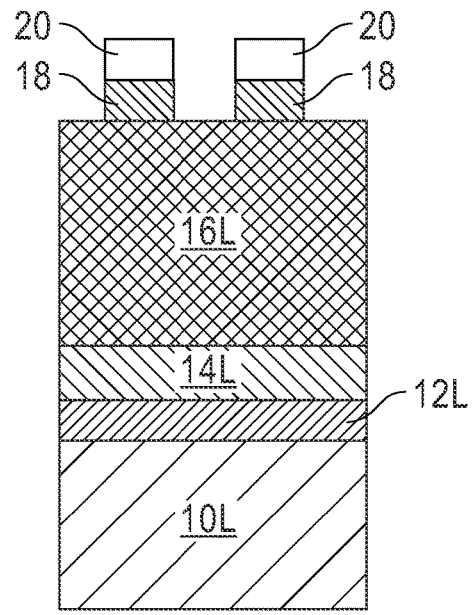
FIGS. 2A-2C are cross sectional views illustrating basic processing steps that can be used in another embodiment of the present application.
Figure 2B:
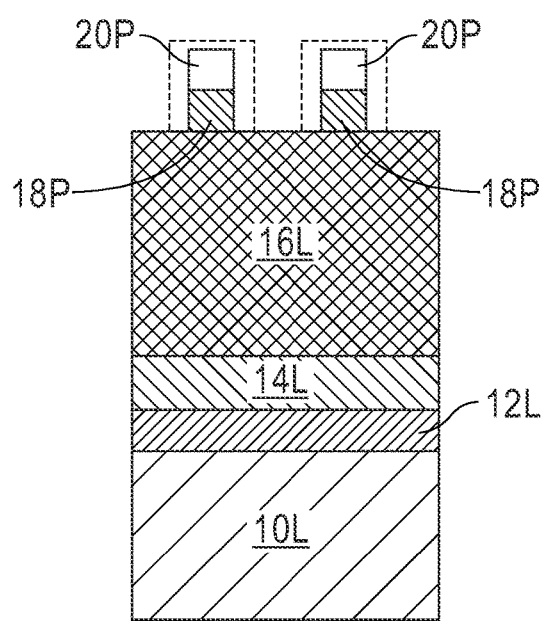
Figure 2C:
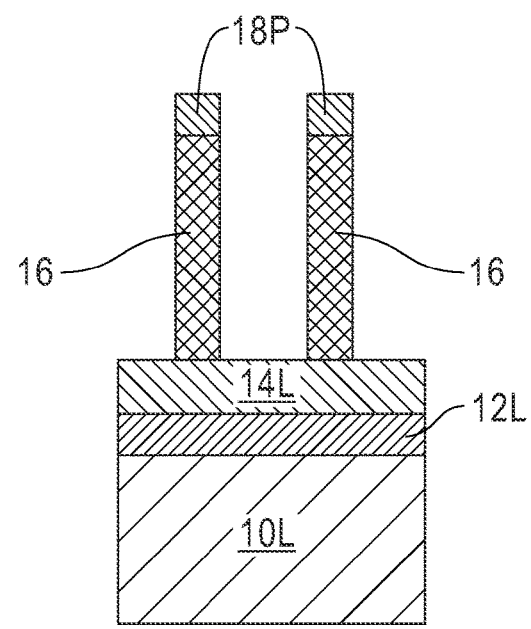

Referring now to FIGS. 2A-2C, which illustrate basic processing steps that can be used in another embodiment of the present application. In this embodiment illustrated in FIGS. 2A-2C, the size, i.e., lateral width, of the metal hard masks 18 can be tuned to provide smaller sized metal hard masks than that shown in FIGS. 1A-1D. The smaller sized metal hard masks in turn provide smaller sized, i.e., lateral width, mandrels 16. FIGS. 2A-2C includes like and corresponding elements as shown in FIGS. 1A-1D, those like and corresponding elements are referred to using like reference numerals.

Referring first to FIG. 2A, there is illustrated a structure that includes the at least one material layer 10L, one or more optional mandrel underlying masking layers including the first mandrel underlying masking layer 12L and the second mandrel underlying masking layer 14L, the mandrel material layer 16L, and mandrel masks, each mandrel mask including the metal hard mask 18 and the optional dielectric oxide mask 20. The structure shown in FIG. 2A is the same as that shown in FIG. 1C thus the processing steps mentioned above and used in providing the structure shown in FIG. 1C can be used here to provide the structure shown in FIG. 2A. At this point of the present application, each metal hard mask 18 and each optional dielectric oxide mask 20 have a first size, i.e., first lateral width. In one example, the first lateral width of each metal hard mask 18 and each optional dielectric oxide mask 20 is from 10 nm to 20 nm. In some instances, this first size needs to be tuned to a smaller size so as to be able to pattern smaller sized mandrels 16.

Referring now to FIG. 2B, there is illustrated the structure of FIG. 2A after shrinking the size, i.e., first lateral width, of each metal hard mask 18 and each optional dielectric oxide mask 20. In FIG. 2B, the dotted line represents the first size, i.e., first lateral width, of the metal hard masks 18 and the optional dielectric oxide masks 20. Each metal hard mask 18 that remains after this shrinking process has been performed can be referred to as a reduced sized metal hard mask 18P, while each dielectric oxide mask 20 that remains after this shrinking process has been performed can be referred to as a reduced sized dielectric oxide mask 20P. This shrinking step can be performed utilizing a wet etching process that removes portions of each metal hard mask 18 and, if present, each dielectric oxide mask 20. In one example, the wet etching process includes dilute hydrofluoric acid, HF. In one embodiment, the dilute HF includes about a 300:1 ratio of water to HF. The wet etching process removes each metal hard mask 18 and, if present, each dielectric oxide mask 20, laterally inward from the original sidewalls to provide the reduced sized metal hard mask 18P and the reduced sized dielectric oxide mask 20P shown in FIG. 2B. Each reduced sized metal hard mask 18P and each reduced sized dielectric oxide mask 20P has a second lateral width that is less than the first lateral width mentioned above.

Referring now to FIG. 2C, there is illustrated the structure of FIG. 2B after transferring the pattern (i.e., mandrel patterned of reduced size) of the mandrel masks including the reduced sized metal hard mask 18P and the reduced sized dielectric oxide mask 20P to provide mandrels 16. This pattern transfer step is identical to the one shown in FIG. 1D above. Note that the structure shown in FIG. 2C is one after each reduced sized dielectric oxide mask 20P has been removed. The mandrels 16 have a smaller size, i.e., lateral width, as compared to the size, i.e., lateral width, of the mandrels 16 shown in FIG. 1D. The pitch of the mandrels 16 of this embodiment is within the range mentioned above for the previous embodiment of the present application.

After patterning the mandrel material layer 16L, conventional pitch doubling processing steps are then performed including forming a mandrel pitch doubling spacer (not shown) on the sidewalls of each of the mandrels 16, removing the mandrels 16 after mandrel pitch doubling spacer formation, and subsequent patterning of the underlying at least one material layer 10L utilizing the mandrel pitch doubling spacers as etch masks. In embodiments of the present application, the reduced sized metal hard mask 18P can be removed prior to, or after, mandrel pitch doubling spacer formation utilizing a material removal process that is selective in removing the metal hard mask material. In some embodiments, the removal of the reduced metal hard mask 18P occurs after mandrel pitch doubling spacer formation so to add protection during the downstream pitch doubling processing.

Figure 3A:
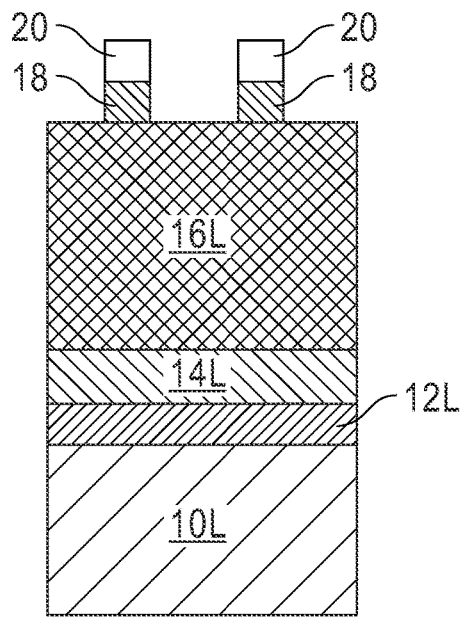
FIGS. 3A-3D are cross sectional views illustrating basic processing steps that can be used in yet another embodiment of the present application.
Figure 3B:
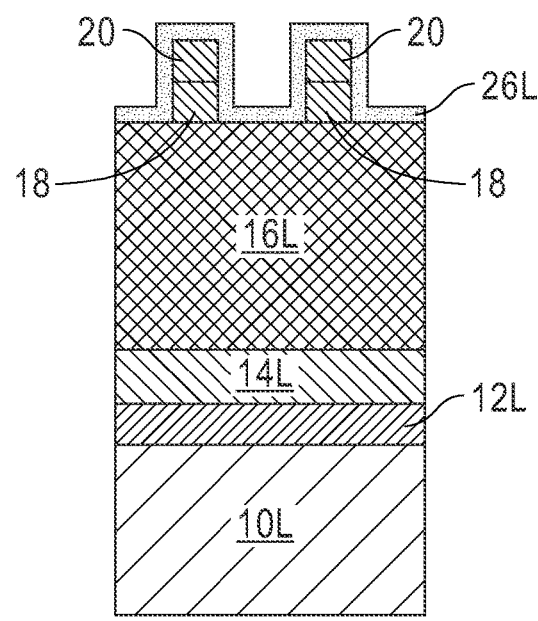
Figure 3C:
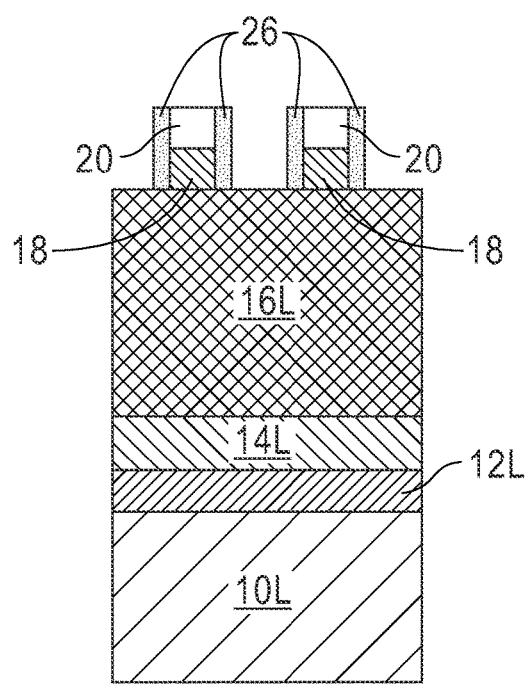

Referring now to FIGS. 3A-3D, there are illustrated basic processing steps that can be used in yet another embodiment of the present application. In this embodiment illustrated in FIGS. 3A-3D, the size, i.e., lateral width, of each metal hard mask 18 can be tuned to provide a larger sized metal hard mask than that shown in FIGS. 1A-1D. The larger sized metal hard masks in turn provide larger sized, i.e., second lateral width, mandrels 16. FIGS. 3A-3C includes like and corresponding elements as shown in FIGS. 1A-1D, those like and corresponding elements are referred to using like reference numerals. In this embodiment, the larger sized metal hard masks include a combination of metal hard mask 18 and metal spacer 26 as shown in FIG. 3C.

Referring first to FIG. 3A, there is illustrated a structure that includes the at least one material layer 10L, one or more optional mandrel underlying masking layers including the first mandrel underlying masking layer 12L and the second mandrel underlying masking layer 14L, the mandrel material layer 16L, and mandrel masks, each mandrel mask includes the metal hard mask 18 and the optional dielectric oxide mask 20. The structure shown in FIG. 3A is the same as that shown in FIG. 1C thus the processing steps mentioned above and used in providing the structure shown in FIG. 1C can be used here to provide the structure shown in FIG. 3A. At this point of the present application, each metal hard mask 18 and each optional dielectric oxide mask 20 have a first size, i.e., first lateral width. In one example, the first lateral width of each metal hard mask 18 and each optional dielectric oxide mask 20 is from 10 nm to 20 nm. In some instances, this first size needs to be tuned to a larger size so as to be able to pattern larger sized mandrels 16.

Referring now to FIG. 3B, there is illustrated the structure of FIG. 3B after forming a metal-containing material layer 26L on the structure shown in FIG. 3A. The metal-containing material layer 26L is composed of one of the metals mentioned above for the metal hard mask layer 18L. In some embodiments, the metal-containing layer 26L is composed of a compositionally same metal as the metal that provides the metal hard mask layer 18L. In other embodiments, the metal-containing layer 26L is composed of a compositionally different than the metal that provides the metal hard mask layer 18L. The metal-containing layer 26L can be formed by a deposition process including, but not limited to, CVD, PECVD, PVD or ALD. In some embodiments, the metal-containing layer 26L is a conformal layer. By "conformal layer" it is meant that a material layer has a vertical thickness along horizontal surfaces that is substantially the same (i.e., within ±5%) as the lateral thickness along vertical surfaces. The metal-containing layer 26L can have a thickness ranging from 1 nm to 20 nm, although lesser and greater thicknesses can also be employed. As is illustrated in FIG. 3B, the metal-containing layer 26L is formed on physically exposed surfaces of each optional dielectric oxide mask 20, each metal hard mask 18 and the mandrel material layer 16L.

Referring now to FIG. 3C, there is illustrated the structure of FIG. 3B after performing a directional etching process to remove the metal-containing layer 26L from all horizontal surfaces of the structure and leaving a portion of the metal-containing layer 26L along the sidewalls of each metal hard mask 18 and, if present, each dielectric oxide mask 20. The remaining portion of the metal-containing layer 26L can be referred to as a metal spacer 26. The metal spacer 26 serves to increase the size, i.e., lateral width, of each metal hard mask 18 such that the combined metal spacer 26 and metal hard mask 18 has an increased lateral (i.e., second) width as compared to the first lateral width of each metal hard mask 18 not including the metal spacers 26. This increased lateral (i.e., second) width provided by the combination of the metal spacer 26 and the metal hard mask 18 is used to increase the size of the mandrel pattern that will be subsequently transferred into the mandrel material layer 16L. In one embodiment, the directional etch includes RIE that selectively lands on the mandrel material layer 16L. The metal spacer 26 are generally I-shaped and have a topmost surface that is coplanar with a topmost surface of the dielectric oxide spacer 20, or the topmost surface of the metal hard mask 18, if the dielectric oxide mask 20 is not present.

Figure 3D:
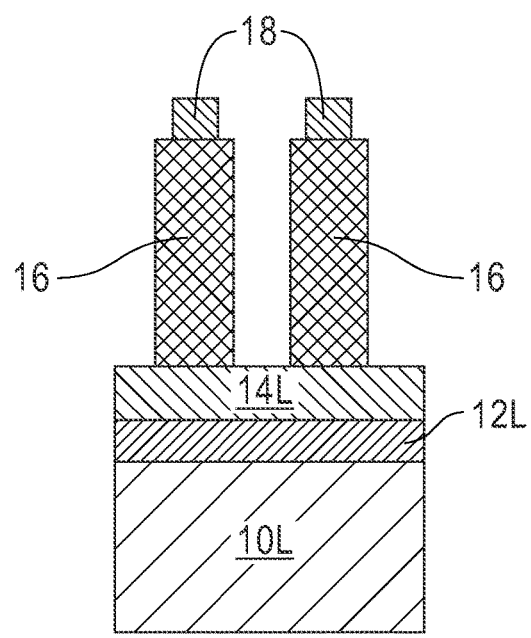

Referring now to FIG. 3D, there is illustrated the structure of FIG. 3C after transferring the pattern (i.e., mandrel patterned of increased size) of each metal hard mask 18/metal spacer 26 combination to provide mandrels 16. This patterning transfer step is identical to the one shown in FIG. 1D above. Note that the structure shown in FIG. 3D is one after the dielectric oxide mask 20 and metal spacer 26 have been removed. The mandrels 16 have an increased size, i.e., lateral width, as compared to the size, i.e., lateral width, of the mandrels 16 shown in FIG. 1D. The pitch of the mandrels 16 of this embodiment is within the range mentioned above for the previous embodiment of the present application.

After patterning the mandrel material layer 16L, conventional pitch doubling processing steps are then performed including forming a mandrel pitch doubling spacer (not shown) on the sidewalls of each of the mandrels 16, removing the mandrels 16 after mandrel pitch doubling spacer formation, and subsequent patterning of the underlying at least one material layer 10L utilizing the mandrel pitch doubling spacers as an etch mask. In embodiments of the present application, each metal hard mask 18 can be removed prior to, or after, mandrel pitch doubling spacer formation utilizing a material removal process that is selective in removing the metal hard mask material. In some embodiments, the removal of each metal hard mask 18 occurs after mandrel pitch doubling spacer formation so to add protection during the downstream pitch doubling processing.

Referring now to FIGS. 4A-4D, there are illustrated one advantage that can be obtained using the method of the present application. This one advantage illustrated in these drawings provides protection to the downstream pitch doubling processing; this example is especially applicable for SALELE. In conventional SALELE pitch doubling processing, a non-mandrel etch can be performed after mandrel pitch doubling spacer formation along the sidewalls of the mandrels 16 to remove subsequently formed dielectric material that is present between the mandrels 16 from the structure. In conventional SALELE pitch doubling processing this non-mandrel etch can damage the mandrels and the mandrel pitch doubling spacers by removing a portion thereof. Such damage effects the height of the mandrels and the pattern that is transferred into the underlying material layer that needs to be patterned. The presence of the metal hard mask 18 on top of the mandrels 16 alleviates this problem. FIGS. 4A-4D includes like and corresponding elements as shown in FIGS. 1A-1D, those like and corresponding elements are referred to using like reference numerals.

Figure 4A:
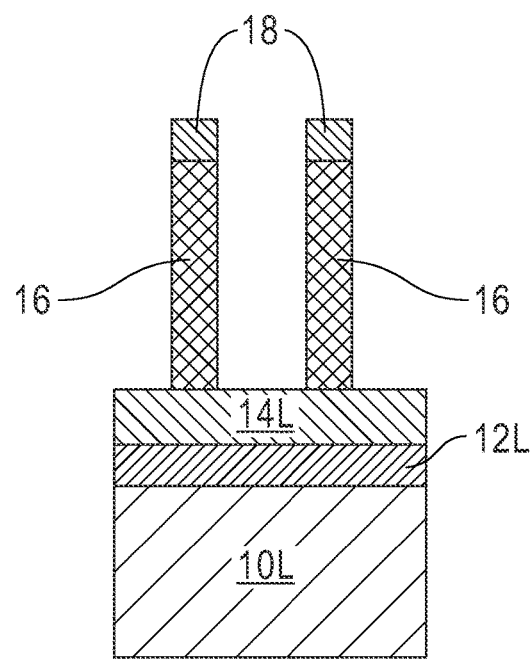
FIGS. 4A-4D are cross sectional views illustrating one advantage that can be obtained using the method of the present application.

Referring first to FIG. 4A, there is illustrated a structure that includes the at least one material layer 10L, one or more optional mandrel underlying masking layers including the first mandrel underlying masking layer 12L and the second mandrel underlying masking layer 14L, the mandrel material layer 16L, and mandrel masks, each mandrel mask includes the metal hard mask 18 and the optional dielectric oxide mask 20. The structure shown in FIG. 4A is the same as that shown in FIG. 1C thus the processing steps mentioned above and used in providing the structure shown in FIG. 1C can be used here to provide the structure shown in FIG. 4A.

Figure 4B:
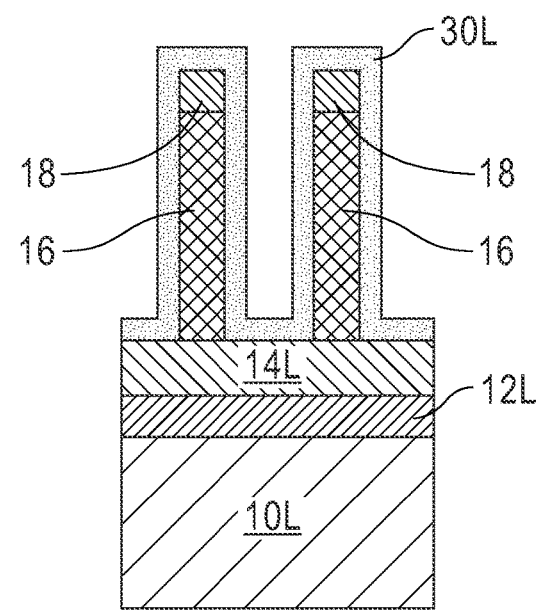

Referring now to FIG. 4B, there is illustrated the structure after forming a mandrel pitch doubling spacer material layer 30L on the structure shown in FIG. 4A. The mandrel pitch doubling spacer material layer 30L is composed of pitch doubling spacer material such as, for example, TiN, $TiO_x$, an oxide or a nitride. In embodiments, the mandrel pitch doubling spacer material layer 30L is compositionally different from at least the mandrels 16. The mandrel pitch doubling spacer material layer 30L can be formed by a deposition process including, but not limited to, CVD, PECVD, PVD or ALD. In some embodiments, the mandrel pitch doubling spacer material layer 30L is a conformal layer, as defined above. The mandrel pitch doubling spacer material layer 30L can have a thickness ranging from 1 nm to 20 nm, although lesser and greater thicknesses can also be employed. As is illustrated in FIG. 4B, the mandrel pitch doubling spacer material layer 30L is formed on physically exposed surfaces of the metal hard mask 18, the mandrel 16 and the topmost mandrel underlying masking layer, or the at least one material layer, if no mandrel underlying masking is employed.

Figure 4C:
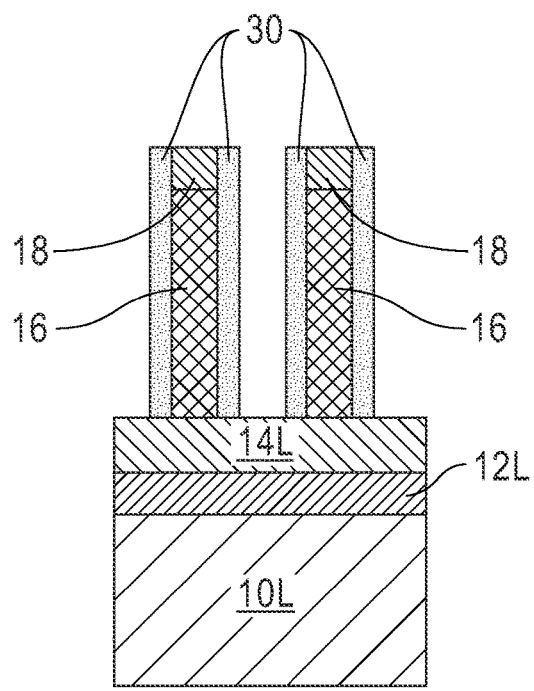

Referring now to FIG. 4C, there is illustrated the structure of FIG. 4C after performing a directional etching process to remove the mandrel pitch doubling spacer material layer 30L from all horizontal surfaces of the structure and leaving a portion of the mandrel pitch doubling spacer material layer 30L along the sidewalls of each metal hard mask 18 and each mandrel 16. The remaining portion of the mandrel pitch doubling spacer material layer 30L can be referred to as a mandrel pitch doubling spacer 30. The mandrel pitch doubling spacers 30 will be used to pattern the at least one material layer 10L after mandrel removal. The mandrel pitch doubling spacers 30 are generally I-shaped and have a topmost surface that is coplanar with a topmost surface of each metal hard mask 18, if the dielectric oxide mask 20 is not present.

Figure 4D:
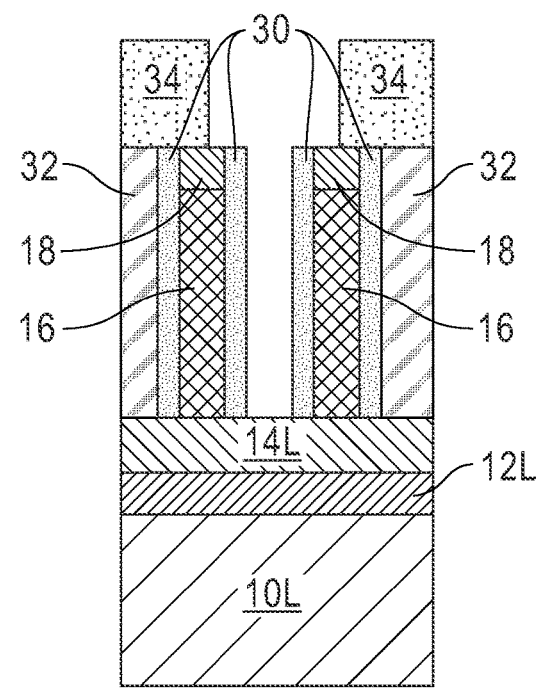

Referring now to FIG. 4D, there is illustrated the structure after forming a dielectric material layer 32 and a patterned photoresist 34, and thereafter removing the dielectric material layer 32 that is located between two adjacent mandrels 16 by etching. The dielectric material layer 32 can include one of the dielectric materials mentioned above for the at least one material layer 10L. The dielectric material layer 32 can be formed utilizing one of the deposition processes mentioned above in forming the at least one material layer 10L that is composed of the dielectric material. A planarization and/or etch back process can follow the deposition of the dielectric material so as to provide a dielectric material layer 32 having a topmost surface that is coplanar with a topmost surface of each of the mandrel pitch doubling spacers 30 and the mandrels 16.

Patterned photoresist 34 is then formed by lithography as mentioned above. The patterned photoresist 34 has an opening that physically exposes the dielectric material layer 32 that is located between adjacent mandrels 16. The exposed dielectric material layer 32 that is located between the between adjacent mandrels 16 is then removed utilizing an etch such as, for example, RIE. The presence of the hard mask 32 mitigates any loss of the mandrels 16 and, in some embodiment in which a metal is used as the mandrel pitch doubling spacers 30, it also mitigates the loss of any loss of the mandrel pitch doubling spacers 30.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a structure, the method comprising:
    forming a mandrel patterning material stack on a mandrel material layer that is located above at least one material layer, wherein the mandrel patterning material stack comprises a metal-containing hard mask layer in direct physical contact with the mandrel material layer and an organic containing soft mask material layer located above the metal-containing hard mask layer;
    first patterning the mandrel patterning material stack to provide a plurality of metal-containing hard masks and a plurality of organic containing soft masks; and
    second patterning the mandrel material layer utilizing the metal-containing hard masks as etch masks so as to provide a plurality of mandrels, wherein the mandrels have a pitch that is less than 36 nm.

2. The method of claim 1, wherein the at least one material layer is present in a back-end-of-the-line (BEOL) region of a semiconductor structure.

3. The method of claim 1, wherein the at least one material layer is a dielectric material, an electrically conductive material or any combination thereof.

4. The method of claim 1, wherein the pitch of the mandrels is from 26 nm to 35 nm.

5. The method of claim 1, wherein each of the metal-containing hard masks has a first lateral width, and the method further comprises tuning the first lateral width to a second lateral width that is different from the first lateral width.

6. The method of claim 5, wherein the first lateral width is greater than the second lateral width, and the tuning comprises shrinking the first lateral width utilizing an etching process that removes a portion of each of the metal-containing hard masks.

7. The method of claim 5, wherein the first lateral width is less than the second lateral width, and the tuning comprises forming a metal spacer along a sidewall of each of the metal-containing hard masks.

8. The method of claim 1, further comprising forming one or more mandrel underlying masking layers between the mandrel material layer and the at least one material layer.

9. The method of claim 1, wherein the first patterning of the mandrel patterning material stack comprises:
    forming a patterned photoresist on top of the mandrel patterning material stack, the patterned photoresist having a mandrel pattern; and
    transferring the mandrel pattern into the organic containing soft mask material layer and the metal-containing hard mask layer of the mandrel patterning material stack by etching so as to provide the plurality of organic containing soft masks and the plurality of metal-containing hard masks, respectively.

10. The method of claim 9, wherein the plurality of organic containing soft masks are removed prior to the patterning of the mandrel material layer.

11. The method of claim 9, wherein the mandrel patterning material stack further comprises a dielectric oxide layer located between the metal-containing hard mask layer and the organic containing soft mask material layer, wherein the dielectric oxide layer is converted to a plurality of dielectric oxide masks during the transferring of the mandrel pattern.

12. The method of claim 11, wherein the metal-containing hard mask layer is composed of titanium nitride, the dielectric oxide layer is composed of silicon dioxide, the organic containing soft mask material layer is composed of an organic planarization layer material, and the mandrel material layer is composed of silicon nitride.

13. The method of claim 1, further comprising forming a mandrel pitch doubling spacer along sidewalls of each of the mandrels and each of the metal-containing hard masks.

14. A method of forming a structure, the method comprising:
    forming a mandrel patterning material stack on a mandrel material layer that is located above at least one material layer that is present in a back-end-of-the-line (BEOL) region of a semiconductor structure, wherein the at least one material layer is a dielectric material, an electrically conductive material or any combination thereof, and wherein the mandrel patterning material stack comprises a metal-containing hard mask layer in direct physical contact with the mandrel material layer and an organic containing soft mask material layer located above the metal-containing hard mask layer;
    first patterning the mandrel patterning material stack to provide a plurality of metal-containing hard masks and a plurality of organic containing soft masks; and
    second patterning the mandrel material layer utilizing the metal-containing hard masks as etch masks so as to provide a plurality of mandrels having a pitch from 26 nm to 64 nm.

15. The method of claim 14, wherein each of the metal-containing hard masks has a first lateral width, and the method further comprises tuning the first lateral width to a second lateral width that is different from the first lateral width.

16. The method of claim 15, wherein the first lateral width is greater than the second lateral width, and the tuning comprises shrinking the first lateral width utilizing an etching process that removes a portion of each of the metal-containing hard masks.

17. The method of claim 15, wherein the first lateral width is less than the second lateral width, and the tuning comprises forming a metal spacer along a sidewall of each of the metal-containing hard masks.

18. The method of claim 14, further comprising forming one or more mandrel underlying masking layers between the mandrel material layer and the at least one material layer.

19. The method of claim 14,
wherein the first patterning of the mandrel patterning material stack comprises:
forming a patterned photoresist on top of the mandrel patterning material stack, the patterned photoresist having a mandrel pattern; and
transferring the mandrel pattern into the organic containing soft mask material layer and the metal-containing hard mask layer of the mandrel patterning material stack by etching so as to provide the plurality of organic containing soft masks and the plurality of metal-containing hard masks, respectively.

20. The method of claim 19, wherein the plurality of organic containing soft masks are removed prior to the patterning of the mandrel material layer.

21. The method of claim 19, wherein the mandrel patterning material stack further comprises a dielectric oxide layer located between the metal-containing mask layer and the organic containing soft mask material layer, wherein the dielectric oxide layer is converted to a plurality of dielectric oxide masks during the transferring of the mandrel pattern.

22. The method of claim 21, wherein the metal-containing hard mask layer is composed of titanium nitride, the dielectric oxide layer is composed of silicon dioxide, the organic containing soft mask material layer is composed of an organic planarization layer material, and the mandrel material layer is composed of silicon nitride.

23. The method of claim 14, further comprising forming a mandrel pitch doubling spacer along sidewalls of each of the mandrels and each of the metal-containing hard masks.

24. A method of forming a semiconductor structure, the method comprising:
forming a mandrel patterning material stack on a mandrel material layer that is located above a material layer, wherein the mandrel patterning material stack comprises a metal-containing hard mask layer in direct physical contact with the mandrel layer and an organic containing soft mask material layer located above the metal-containing hard mask layer;
first patterning the mandrel patterning material stack to provide a plurality of metal-containing hard masks and a plurality of organic containing soft masks;
shrinking the first lateral width of each of the metal-containing hard masks to a second lateral width by etching; and
second patterning the mandrel material layer utilizing the metal-containing hard masks having the second lateral width as etch masks so as to provide a plurality of mandrels.

25. A method of forming a semiconductor structure, the method comprising:
forming a mandrel patterning material stack on a mandrel material layer that is located above a material layer, wherein the mandrel patterning material stack comprises a metal-containing hard mask layer in direct physical contact with the mandrel layer and an organic containing soft mask material layer located above the metal-containing hard mask layer;
first patterning the mandrel patterning material stack to provide a plurality of metal-containing hard masks and a plurality of organic containing soft masks;
increasing the first lateral width of each of the metal-containing hard masks to a second lateral width by forming a metal spacer along a sidewall of each of the metal hard masks; and
second patterning the mandrel material layer utilizing the metal-containing hard masks having the second lateral width as etch masks so as to provide a plurality of mandrels.

* * * * *